(12) United States Patent
Luo et al.

(10) Patent No.: US 12,029,002 B2
(45) Date of Patent: Jul. 2, 2024

(54) ELECTRONIC DEVICE

(71) Applicant: VIVO MOBILE COMMUNICATION CO., LTD., Dongguan (CN)

(72) Inventors: Xiandong Luo, Dongguan (CN); Ruhao Lin, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 177 days.

(21) Appl. No.: 17/888,887

(22) Filed: Aug. 16, 2022

(65) Prior Publication Data

US 2022/0400570 A1 Dec. 15, 2022

Related U.S. Application Data

(63) Continuation of application No. PCT/CN2021/074668, filed on Feb. 1, 2021.

(30) Foreign Application Priority Data

Mar. 2, 2020 (CN) .......................... 202010136441.X (51) Int. Cl.
*H05K 7/14* (2006.01)

(52) U.S. Cl.
CPC .................................. *H05K 7/1401* (2013.01)

(58) Field of Classification Search
CPC ... H05K 7/1401; G06F 1/1624; G06F 1/1626; G06F 1/1684; G06F 1/1686; H04M 1/0256; H04M 1/026; H04M 1/0237; H04M 1/0264; H04N 23/57
See application file for complete search history.

(56) References Cited

U.S. PATENT DOCUMENTS 5,825,616 A * 10/1998 Howell .................. G06F 1/1616
6,510,051 B2 * 1/2003 Kim ...................... G06F 1/1632
361/679.41
10,832,101 B2 * 11/2020 Ho ...................... H01R 12/7005
(Continued)

FOREIGN PATENT DOCUMENTS

CN 206004717 U 3/2017
CN 107911579 A 4/2018
CN 108495018 A 9/2018
(Continued)

*Primary Examiner* — Anthony Q Edwards
*Assistant Examiner* — Hung Q Dang
(74) *Attorney, Agent, or Firm* — The Webb Law Firm (57) ABSTRACT

An electronic device, including: a device body, provided with a first accommodating space, a second accommodating space, and a first opening; a functional module; and an ejection mechanism, including a connecting rod, a slider, and a driving part. A guide rail is disposed on the slider, and the guide rail includes a first limiting section, an extending section, a second limiting section, and a retracting section which are connected in sequence. In a case that the slider is located at a second position, at least a portion of the functional module is located outside the first accommodating space, and a second end of the connecting rod is matched with the first limiting section. In a case that the slider is located at a first position, the functional module is located inside the first accommodating space, and the second end of the connecting rod is matched with the second limiting section.

14 Claims, 7 Drawing Sheets

(56) References Cited

U.S. PATENT DOCUMENTS 11,388,275 B2 * 7/2022 Liao ................. G03B 30/00

FOREIGN PATENT DOCUMENTS

| | | |
|---|---|---|
| CN | 207869232 U | 9/2018 |
| CN | 207926736 U | 9/2018 |
| CN | 207968575 U | 10/2018 |
| CN | 109218480 A | 1/2019 |
| CN | 109379517 A | 2/2019 |
| CN | 109933141 A | 6/2019 |
| CN | 109995904 A | 7/2019 |
| CN | 209330169 U | 8/2019 |
| CN | 110519418 A | 11/2019 |
| CN | 110557470 A | 12/2019 |
| CN | 110581938 A | 12/2019 |
| CN | 209748616 U | 12/2019 |
| CN | 111405086 A | 7/2020 |
| CN | 111432593 A | 7/2020 |
| JP | 2003196646 A | 7/2003 |
| WO | 2019192756 A1 | 10/2019 |
| WO | 2019228324 A1 | 12/2019 |
| WO | WO-2019228324 A1 * | 12/2019 ............... H05K 7/14 |

* cited by examiner

ELECTRONIC DEVICE

CROSS-REFERENCE TO RELATED APPLICATIONS

This application is a Bypass Continuation Application of PCT/CN2021/074668 filed Feb. 1, 2021, and claims priority to Chinese Patent Application No. 202010136441.X filed Mar. 2, 2020, the disclosures of which are hereby incorporated by reference in their entirety.

BACKGROUND OF THE INVENTION

Field of the Invention

The present application relates to the field of communication device technologies, and in particular, to an electronic device.

Description of Related Art

With the progress of technologies and the development of electronic devices, users' demands for the screen-to-body ratio of the electronic devices are gradually increasing, and increasing the screen-to-body ratio of the electronic devices has gradually become a development trend. A relatively large screen-to-body ratio causes the electronic devices to have some functional modules embedded inside the electronic devices. When a functional module needs to work, the functional module may be driven by a driving mechanism to extend out of the housing of the electronic devices to work. The functional module with such a structure does not occupy the panel surface space of the electronic devices, so as to enable an increase of the screen-to-body ratio.

SUMMARY OF THE INVENTION

An electronic device is provided, including: a device body, where the device body is provided with a first accommodating space, a second accommodating space, and a first opening in communication with the first accommodating space, where the second accommodating space is in communication with the first accommodating space; a functional module, where the functional module has a first state and a second state; and an ejection mechanism, where the ejection mechanism includes a connecting rod, a slider, and a driving part, where the functional module is detachably connected to the slider, a guide rail is disposed on the slider, and the guide rail includes a first limiting section, an extending section, a second limiting section, and a retracting section connected in sequence; at least a portion of the driving part is disposed inside the second accommodating space, the driving part drives the slider to move along a direction perpendicular to the first opening, a first end of the connecting rod is hinged to an inner wall of the second accommodating space, and a second end of the connecting rod is slidably matched with the guide rail; in a case that the functional module is in the first state, the functional module is separated from the slider; in a case that the functional module is in the second state, the functional module is connected to the slider, and the slider is movable between a first position and a second position, in a case that the slider is located at the first position, the slider is located inside the second accommodating space, and in a case that the slider is located at the second position, at least a portion of the slider is located outside the second accommodating space; in the case that the slider is located at the second position, at least a portion of the functional module is located outside the first accommodating space, and the second end of the connecting rod is matched with the first limiting section; and in the case that the slider is located at the first position, the functional module is located inside the first accommodating space, and the second end of the connecting rod is matched with the second limiting section.

BRIEF DESCRIPTION OF THE DRAWINGS

Accompanying drawings described herein are used for providing understanding about the present application, and constitute one portion of the present application. Exemplary embodiments of the present application and descriptions thereof are used for explaining the present application, and do not constitute an inappropriate limitation on the present application. In the accompanying drawings.

DESCRIPTION OF REFERENCE SIGNS

100—device body, 110—first accommodating space, 111—fourth electrical interface, 120—second accommodating space, 121—first guide post, 130—first opening, 140—first housing, 141—elastic arm, 150—second housing, 151—separator;

200—functional module, 210—first electrical interface, 220—second magnetic attraction part, 230—sling hole;

300—connecting rod;

400—slider, 410—guide rail, 411—first limiting section, 412—extending section, 413—second limiting section, 414—retracting section, 415—first annular protrusion, 416—second annular protrusion, 420—second guide post;

500—driving part;

600—connecting base, 610—second electrical interface, 620—third electrical interface, 630—first magnetic attraction part.

DESCRIPTION OF THE INVENTION

To make the objectives, technical solutions, and advantages of the present application clearer, the technical solutions of the present application are described clearly below with reference to embodiments of the present application and corresponding accompanying drawings. Apparently, the described embodiments are merely some embodiments rather than all of the embodiments of the present application.

All other embodiments derived by a person of ordinary skill in the art based on the embodiments of the present application shall fall within the protection scope of the present application.

The functional modules of the existing electronic devices can only work at extended positions and have the problem of poor flexibility in use.

The technical solutions disclosed in the embodiments of the present application are described below in detail with reference to the accompanying drawings.

As shown in FIG. 1 to FIG. 10, an electronic device is disclosed in this embodiment of the present application. The disclosed electronic device includes a device body 100, a functional module 200, and an ejection mechanism.

The device body 100 is provided with a first accommodating space 110, a second accommodating space 120, and a first opening 130 in communication with the first accommodating space 110. The second accommodating space 120 is in communication with the first accommodating space 110. For example, the second accommodating space 120 has a second opening. The first accommodating space 110 is in communication with the second accommodating space 120 through the second opening. The first accommodating space 110 can provide a mounting position for the functional module 200. The functional module 200 can retract into the first accommodating space 110 through the first opening 130. Alternatively, at least a portion of the functional module 200 can extend out of the first accommodating space 110 through the first opening 130. The second accommodating space 120 can provide a mounting position for the ejection mechanism. The first opening 130 may be provided on a second housing 150 of the device body 100. Optionally, the first opening 130 may be provided on a middle frame of the second housing 150. The first opening 130 may also be provided at another position of the second housing 150. A position of the first opening 130 is not limited in the embodiments of the present application.

The functional module 200 may include at least one of a camera, a light filling module, a fingerprint identification module, a microphone, an electrical connection port, a data card, and a phone receiver. Certainly, the functional module 200 may also be another type of functional device. A type of the functional module 200 is not limited in the embodiments of the present application.

The ejection mechanism includes a connecting rod 300, a slider 400, and a driving part 500. The functional module 200 is detachably connected to the slider 400. A guide rail 410 is disposed on the slider 400. The guide rail 410 includes a first limiting section 411, an extending section 412, a second limiting section 413, and a retracting section 414 connected in sequence. Both the extending section 412 and the retracting section 414 implement the function of connecting the first limiting section 411 and the second limiting section 413. For example, one end of the first limiting section 411 is connected to an opposite end of the second limiting section 413 by the extending section 412, and an other end of the first limiting section 411 is connected to an opposite end of the second limiting section 413 by the retracting section 414.

In an installation process, at least a portion of the driving part 500 is disposed inside the second accommodating space 120, and the driving part 500 can drive the slider 400 to move along a direction perpendicular to the first opening 130. In a case that the functional module 200 is connected to the slider 400, the driving part 500 can drive the slider 400 to move and make at least a portion of the slider 400 extend out of the second accommodating space 120 through the second opening, so as to push the functional module 200 to move and make at least a portion of the functional module 200 extend out of the first accommodating space 110 through the first opening 130. The driving part 500 may be a spiral telescopic spring or an elastic rubber element. A type of the driving part 500 is not limited in the embodiments of the present application.

A first end of the connecting rod 300 is hinged to an inner wall of the second accommodating space 120, and a second end of the connecting rod 300 is slidably matched with the guide rail 410, so that the second end of the connecting rod 300 slides to respective parts of the guide rail 410 during the movement of the slider 400. For example, the first end of the connecting rod 300 is rotated, to enable the second end of the connecting rod 300 to adaptively is slidably matched with the first limiting section 411, the extending section 412, the second limiting section 413, and the retracting section 414. Both the matching between the second end of the connecting rod 300 and the first limiting section 411, and the matching between the second end of the connecting rod 300 and the second limiting section 413 can maintain the slider 400 at a specified position. In this case, in a case that the slider 400 is connected to the functional module 200, the functional module 200 can be maintained by the slider 400 at an extending position and a retracting position that are described above.

Optionally, the first limiting section 411 may include a first sub-limiting section and a second sub-limiting section. The first sub-limiting section and the second sub-limiting section are disposed spaced apart. The second limiting section 413 may be a broken-line limiting section. One end of the first sub-limiting section is connected to a first end of the broken-line limiting section by the extending section 412, and one end of the second sub-limiting section is connected to a second end of the broken-line limiting section by the retracting section 414. In an optional implementation, the extending section 412 and the retracting section 414 may be disposed opposite to each other and inclinedly. A distance between one end of the extending section 412 close to the first sub-limiting section and one end of the retracting section 414 close to the second sub-limiting section is a first distance, and a distance between one end of the extending section 412 close to the broken-line limiting section and one end of the retracting section 414 close to the broken-line limiting section is a second distance, where the first distance is smaller than the second distance, so that a portion of the guide rail 410 may be in an "M"-shaped structure. In this embodiment of the present application, the extending section 412 and the retracting section 414 are disposed inclinedly, to guide the second end of the connecting rod 300 better, so that the second end of the connecting rod 300 has smaller resistance when moving between the first limiting section 411 and the second limiting section 413, and slides more steadily, thereby preventing the second end of the connecting rod 300 from being suck during movement.

Figure 1:
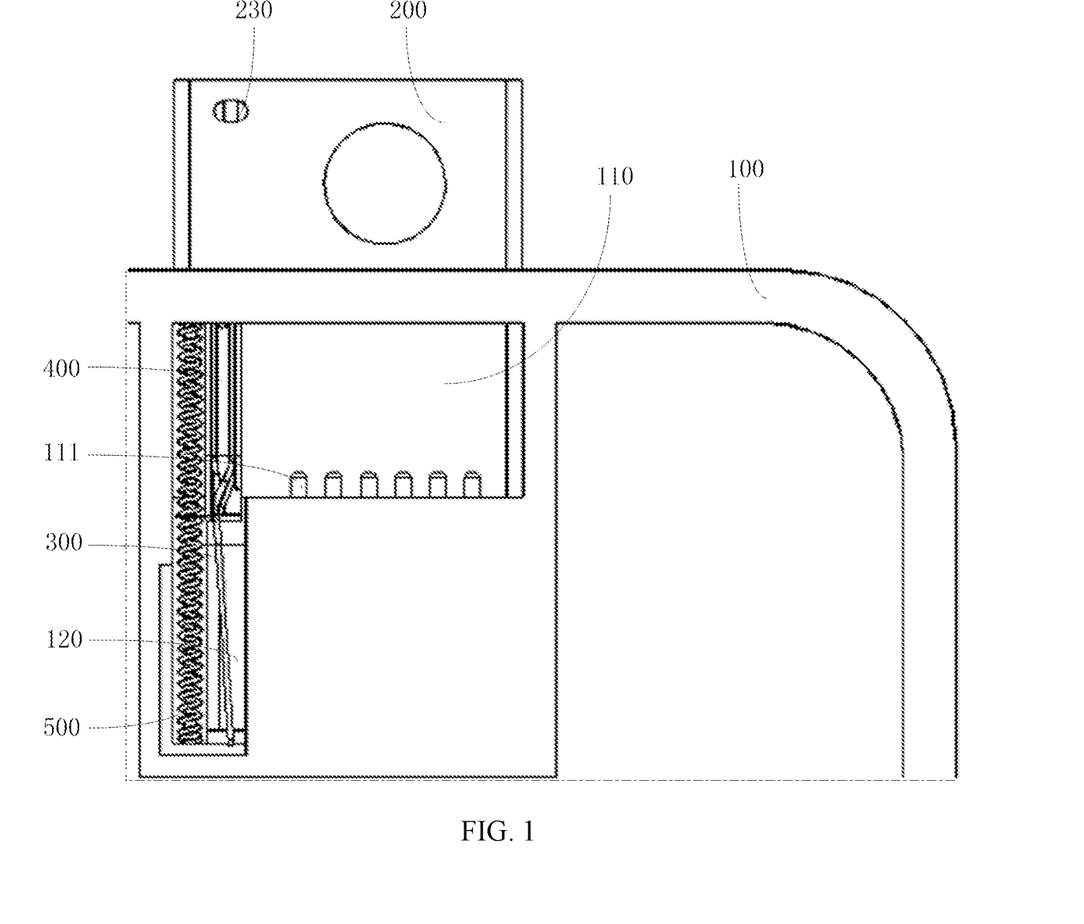
FIG. 1 is a partial schematic structural diagram of an electronic device disclosed in an embodiment of the present application.
Figure 2:
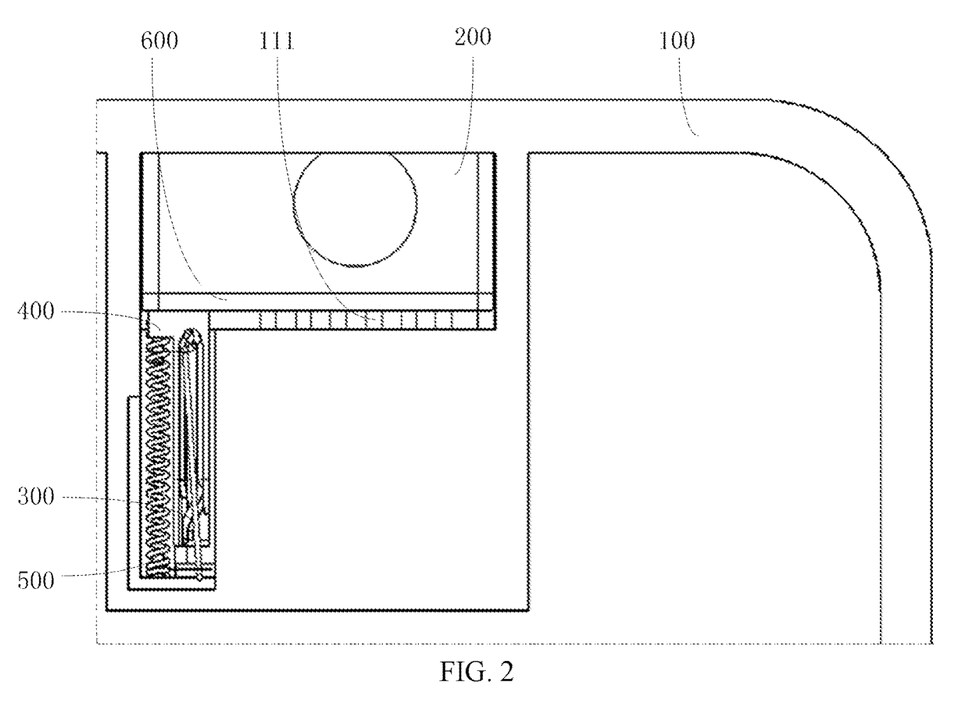
FIG. 2 is a partial schematic structural diagram of an electronic device disclosed in an embodiment of the present application in another state.
Figure 3:
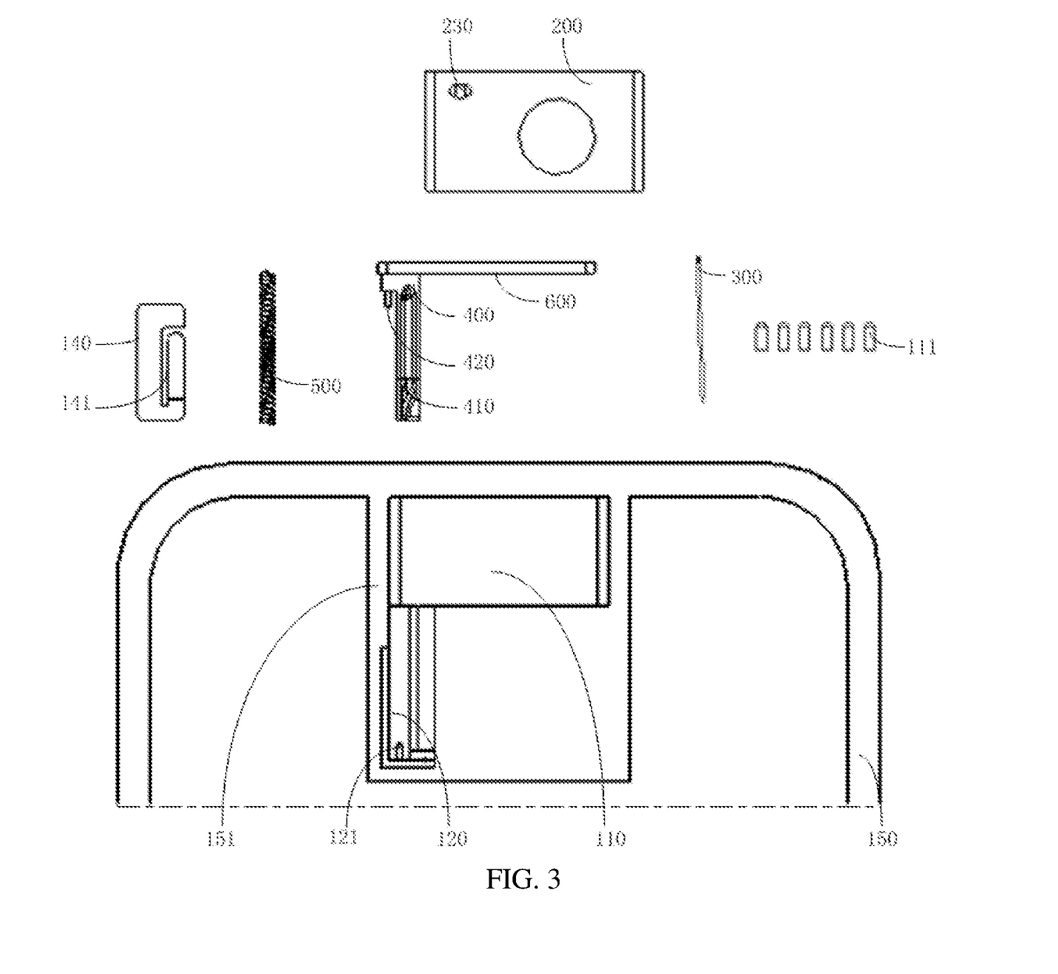
FIG. 3 is a partial exploded view of the electronic device disclosed in an embodiment of the present application.
Figure 4:
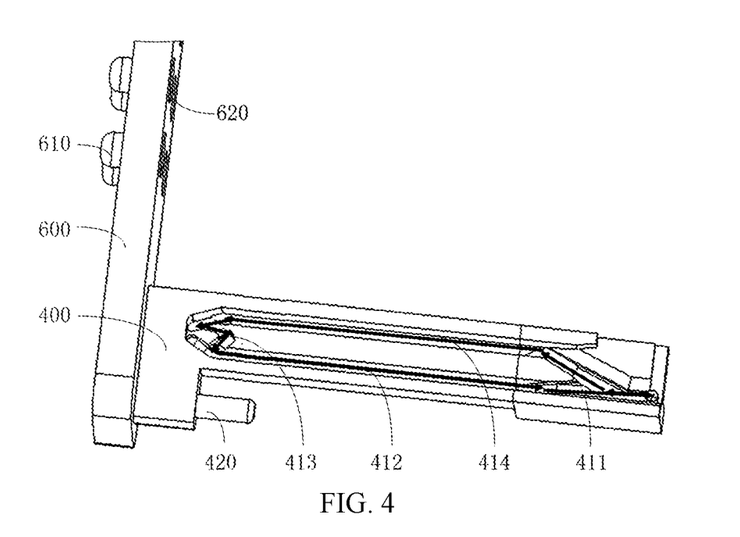
FIG. 4, FIG. 5, and FIG. 6 are respectively partial schematic structural diagrams of an electronic device disclosed in an embodiment of the present application from different perspectives.
Figure 5:
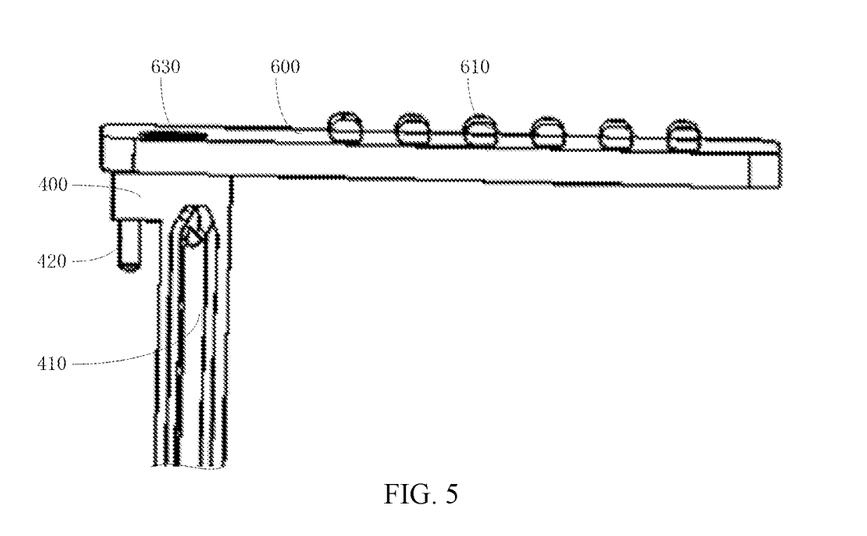
Figure 6:
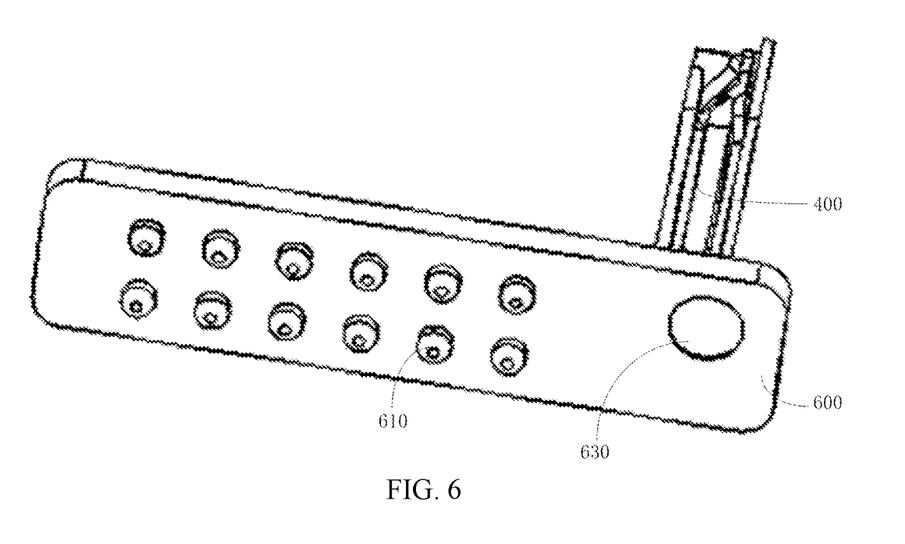
Figure 7:
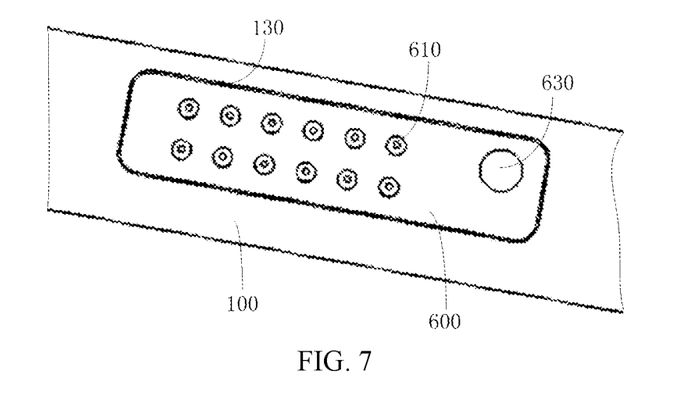
FIG. 7 is a partial schematic structural diagram of an electronic device disclosed in another embodiment of the present application.
Figure 8:
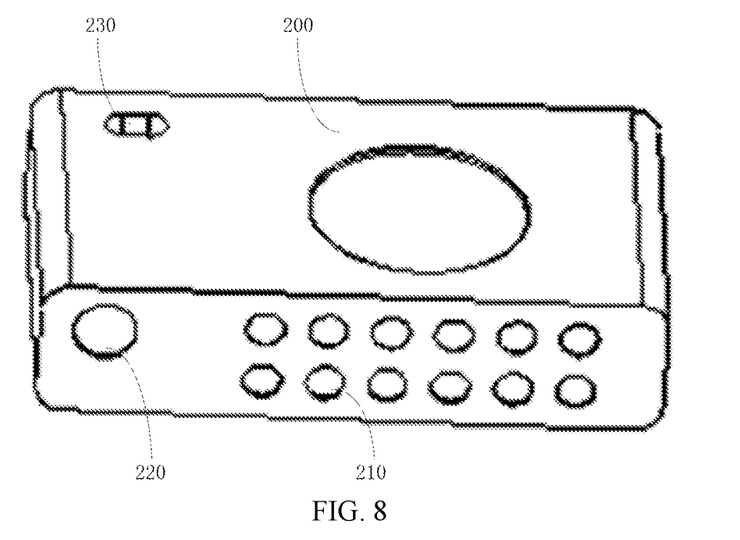
FIG. 8 and FIG. 9 are respectively schematic structural diagrams of a functional module disclosed in an embodiment of the present application from different perspectives.
Figure 9:
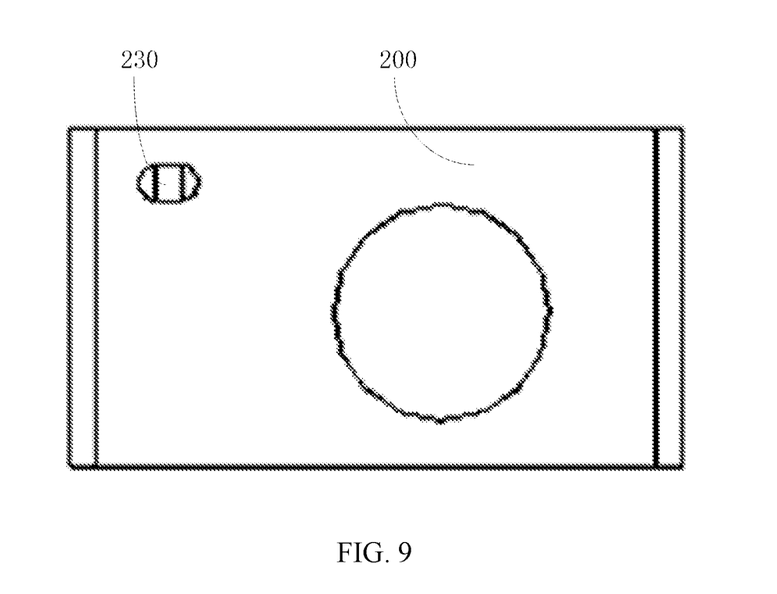

Optionally, as shown in FIG. 4, the guide rail 410 may be an annual rail. For example, a first end of the first limiting section 411 is connected to the extending section 412, and a second end of the first limiting section 411 is connected to the retracting section 414. A first end of the second limiting section 413 is connected to the extending section 412, and a second end of the second limiting section 413 is connected to the retracting section 414. In this case, when the slider 400 is connected to the functional module 200, in a case that the functional module 200 is continuously pressed by a user, the second end of the connecting rod 300 can slide relative to the guide rail 410. Referring to FIG. 4 again (the arrow in the figure refers to a movement direction of the second end of the connecting rod 300), the second end of the connecting rod 300 can enter the retracting section 414 from the first limiting section 411, enter the second limiting section 413 from the retracting section 414, enter the extending section 412 from the second limiting section 413, and enter the first limiting section 411 from the extending section 412, and repeat the process in sequence as being pressed. The extending section 412 and the retracting section 414 implement a guiding function, to cause the second end of the connecting rod 300 to switch between matching the first limiting section 411 and matching the second limiting section 413, so that the movement of the second end of the connecting rod 300 is smoother.

In this embodiment of the present application, the functional module 200 has a first state and a second state. In a case that the functional module 200 is in the first state, the functional module 200 is separated from the slider 400. In this case, the functional module 200 may be separated from the device body 100, so that the functional module 200 can work away from the device body 100.

In a case that the functional module 200 is in the second state, the functional module 200 is connected to the slider 400, and the slider 400 is movable between a first position and a second position.

For example, in a case that the slider 400 is at the first position, the slider 400 is located inside the second accommodating space 120, and the second end of the connecting rod 300 is matched with the second limiting section 412 to restrict the slider 400 from moving toward the first opening 130. The matching between the second end of the connecting rod 300 and the second limiting section 412 can maintain the slider 400 at the first position. In a case that the slider 400 is at the second position, at least a portion of the slider 400 is located outside the second accommodating space 120, and the second end of the connecting rod 300 is matched with the first limiting section 411 to restrict the slider 400 from moving toward the first opening 130. The matching between the second end of the connecting rod 300 and the first limiting section 411 can maintain the slider 400 at the second position. An acting force generated by the second end of the connecting rod 300 on the slider 400 is opposite to an acting force generated by the driving part 500 on the slider 400, so that the slider 400 can be maintained at a corresponding position.

Based on this, since the functional module 200 is connected to the slider 400, in a case that the slider 400 is at the second position, at least a portion of the functional module 200 is located outside the first accommodating space 110. In a case that the slider 400 is at the first position, the functional module 200 is located inside the first accommodating space 110. Therefore, the functional module 200 can be maintained at a corresponding position by maintaining the slider 400 at a corresponding position.

In use, after the functional module 200 finishes working, the user may manually press the functional module 200. Optionally, the functional module 200 enables the slider 400 to overcome the acting force of the driving part 500. The second end of the connecting rod 300 can slide from the first limiting section 411 through the retracting section 414 to a position at which the second end of the connecting rod 300 is matched with the second limiting section 413. The slider 400 is located at the first position to make the functional module 200 be located inside the first accommodating space 110. Under the action of the acting force of the driving part 500 and the matching of the second limiting section 413, the functional module 200 can be maintained at the position inside the first accommodating space 110. When needing the functional module 200 to work, the user may press the functional module 200 again, to enable the slider 400 to overcome the acting force of the driving part 500. The second end of the connecting rod 300 may slide from the second limiting section 413 through the extending section 412 to a position at which the second end of the connecting rod 300 is matched with the first limiting section 411. At the same time, the slider 400 drives the functional module 200 to make at least a portion of the functional module 200 extend out of the first accommodating space 110 through the first opening 130. Under the action of the acting force of the driving part 500 and the matching of the second limiting section 413, the slider 400 can be maintained at the first position. In this case, at least a portion of the functional module 200 may be maintained at a position inside the first accommodating space 110, and the functional module 200 may also be separated from the slider 400, so that the functional module 200 can work away from the device body 100.

It can be seen from the above working process that in the electronic device disclosed in the embodiments of the present application, the functional module 200 is detachably connected to the slider 400. The functional module 200 can extend out of the first accommodating space 110 or retract into the first accommodating space 110 through the slider 400. Compared with that the functional module 200 of the existing electronic device needs to be connected to components, such as a driving motor and a speed reducer, to move, in the disclosed embodiments of the present application, the functional module 200 and the slider 400 can be in a separated state, so that the functional module 200 not only can work outside the first accommodating space 110, but also can work separately from the device body 100. In addition, the user only needs to press the functional module 200 to implement installation and removal of the functional module 200, thereby facilitating driving of the functional module 200 and improving the flexibility of the functional module 200.

Correspondingly, the above ejection mechanism is a manual driving mechanism, which enables the functional module 200 to enter and exit the first accommodating space 110 without power consumption, so that the power consumption of the entire electronic device can be reduced. In addition, both the functional module 200 and the ejection mechanism have an independent installation space, so that the ejection mechanism drives the functional module 200 relatively steadily.

Optionally, to enable the ejection mechanism to drive the functional module 200 more steady, in an optional solution, the ejection mechanism may further include a connecting base 600. The connecting base 600 may be connected to the slider 400, and the slider 400 is detachably connected to the functional module 200 by the connecting base 600. In this case, the slider 400 may drive, through the connecting base 600, the functional module 200 to move. It should be noted that in a telescopic direction of the functional module 200, the projection area of the connecting base 600 is larger than the projection area of the slider 400. In this case, compared with a contact area between the slider 400 and the functional module 200, the contact area between the connecting base 600 and the functional module 200 is larger, so that the driving forces of the connecting base 600 on positions of the functional module 200 are evener, thereby enabling the slider 400 to drive the functional module 200 more steadily.

Optionally, in a case that the functional module 200 is in the first state, the connecting base 600 may be hermetically connected to the first opening 130. In this case, the connecting base 600 may block the first opening 130, so that the first accommodating space 110 and the second accommodating space 120 form a sealed space, thereby implementing a water-proof and dust-proof function. Optionally, a seal ring may be disposed between the connecting base 600 and the first opening 130, the connecting base 600 may be hermetically connected to the first opening 130 by the seal ring. Certainly, the connecting base 600 may also be hermetically connected to the first opening 130 in various manners. A manner in which the connecting base 600 is hermetically connected to the first opening 130 is not limited in the embodiments of the present application.

Optionally, in a case that the functional module 200 is in the first state, an outer surface of the connecting base 600 is flush with an outer surface on which the first opening 130 is located. In this case, when the functional module 200 is separated from the device body 100, the connecting base 600 blocks the first opening 130, and an outer surface of the connecting base 600 is flush with the outer surface on which the first opening 130 is located, which not only implements the water-proof and dust-proof function, but also makes the appearance of the electronic device better.

Correspondingly, in a case that the ejection mechanism includes the connecting base 600, a first electrical interface 210 may be disposed on the functional module 200, a second electrical interface 610 may be disposed on one side of the connecting base 600 away from the slider 400, and a third electrical interface 620 may be disposed on one side of the connecting base 600 facing the slider 400. The second electrical interface 610 is electrically connected to the third electrical interface 620. A fourth electrical interface 111 may be disposed in the first accommodating space 110. In a case that the functional module 200 is located inside the first accommodating space 110, the first electrical interface 210 may be electrically connected to the second electrical interface 610, and the third electrical interface 620 may be electrically connected to the fourth electrical interface 111. In conclusion, in this way, the functional module 200 may be electrically connected to the device body 100, so that the functional module 200 can implement functions such as data transmission and charging.

In the embodiments of the present application, the functional module 200 may be detachably connected to the connecting base 600 in various manners. For example, the functional module 200 may be connected to the connecting base 600 in a manner such as engagement, a threaded connection, or magnetic attraction. Optionally, a first magnetic attraction part 630 may be disposed on one of the functional module 200 or one side of the connecting base 600 away from the slider 400, and a second magnetic attraction part 220 may be disposed on another of the functional module 200 or one side of the connecting base 600 away from the slider 400. In a case that the functional module 200 is in the second state, the first magnetic attraction part 630 is magnetically connected to the second magnetic attraction part 220. Compared with other manners, such a manner not only facilitates the connection between the functional module 200 and the connecting base 600, but also helps the user to relatively easily take out the functional module 200 from the first accommodating space 110.

Optionally, the first magnetic attraction part 630 may be disposed on the functional module 200, and the second magnetic attraction part 220 may be disposed on the one side of the connecting base 600 away from the slider 400. In addition, the second magnetic attraction part 220 may be an electromagnet. In a case that the functional module 200 is located inside the first accommodating space 110, in view of the above, the connecting base 600 may be electrically connected to the fourth electrical interface 111 through the third electrical interface 620. Therefore, the second magnetic attraction part 220 on the connecting base 600 is energized to generate magnetic attraction, so that the first magnetic attraction part 630 is magnetically connected to the second magnetic attraction part 220, so that the functional module 200 can be maintained in the first accommodating space 110. In addition, in a case that at least a portion of the slider 400 is located outside the second accommodating space 120, the second magnetic attraction part 220 on the connecting base 600 is not energized, so that there is no magnetic attraction between the first magnetic attraction part 630 and the second magnetic attraction part 220, thereby enabling the user to relatively easily take out the functional module 200 from the first accommodating space 110.

In the embodiments of the present application, in an optional solution, the driving part 500 may be an elastic member. One end of the elastic member may be connected to the inner wall of the second accommodating space 120, and an other end of the elastic member may be connected to the slider 400. Compared with the driving part 500 with another structure, the elastic member has a larger elastic deformation capability, which makes it easier to drive the slider 400. In addition, in a case that the driving part 500 is an elastic member, the service life of the driving part 500 can be prolonged. The elastic member may be a telescopic spring. Certainly, the elastic member may also be another elastic component. A structure of the elastic member is not limited in the present application.

In an actual assembly process, to improve the assembly performance, in an optional solution, a first guide post 121 may be disposed on the inner wall of the second accommodating space 120, and a second guide post 420 may be disposed on the slider 400. One end of the elastic member is sleeved on the first guide post 121, and an other end of the elastic member is sleeved on the second guide post 420, so as to facilitate the installation and removal of the elastic member.

In this embodiment of the present application, in another optional solution, the driving part 500 may include a third magnetic attraction part and a fourth magnetic attraction part. The third magnetic attraction part may be disposed inside the second accommodating space 120, and the fourth magnetic attraction part may be connected to the slider 400. The third magnetic attraction part and the fourth magnetic attraction part are disposed opposite to each other, and the third magnetic attraction part has the same magnetic property as the fourth magnetic attraction part. In this case, an acting force toward the first opening 130 is generated due to the repulsion between the third magnetic attraction part and the fourth magnetic attraction part that have the same magnetic property, thereby indirectly causing the slider 400 to have an acting force toward the first opening 130, and eventually, drive the slider 400. In this way, the driving forces received by the slider 400 are evener, so that the movement of the slider 400 is more steady.

In the embodiments disclosed in the present application, the second end of the connecting rod 300 maintains the position of the slider 400, and there may be various structures of the second end of the connecting rod 300. In an optional solution, the second end of the connecting rod 300 may be a pull hook. The pull hook is hung on the guide rail 410. The pull hook is hung on the first limiting section 411 and the second limiting section 413 respectively to be matched with the first limiting section 411 and the second limiting section 413 respectively in a limiting manner. For example, in a case that at least a portion of the functional module 200 is located outside the first accommodating space 110, the pull hook is hung on and is matched with the first limiting section 411, and in this case, at least part of the slider 400 is located outside the second accommodating space 120. In a case that the functional module 200 is located inside the first accommodating space 110, the pull hook is hung on and is matched with the second limiting section 413, and in this case the slider 400 is located inside the second accommodating space 120. In this case, the second end of the connecting rod 300 is disposed between the first opening 130 and the first end of the connecting rod 300. The connecting rod 300 exerts a pulling force on the slider 400, so as to restrict the slider 400 from moving toward the extending direction of the functional module 200, so that the slider 400 can be maintained at the first position or the second position. Both the first limiting section 411 and the second limiting section 413 may be concave, to be conveniently hung on by the pull hook in a limiting manner.

Certainly, in the above embodiments, the first end of the connecting rod 300 is located on one side of the slider 400 away from the first opening 130, so that the entire connecting rod 300 is closer to a central region of the device body 100. Since a circuit board and many electronic components disposed in the central region of the device body 100, the connecting rod 300 is likely to interfere with the circuit board or the electronic components. Therefore, in another optional solution, the second end of the connecting rod 300 may be an abutting part, and the abutting part abuts against the guide rail 410. For example, in a case that at least a portion of the functional module 200 is located outside the first accommodating space 110, the abutting part abuts against the second limiting section 413, and in this case, the slider 400 is located outside the second accommodating space 120. In a case that the functional module 200 is located inside the first accommodating space 110, the abutting part abuts against the first limiting section 411, and in this case, the slider 400 is located inside the second accommodating space 120. In this case, the first end of the connecting rod 300 is located between the first opening 130 and the second end of the connecting rod 300. The acting force exerted by the abutting part on the slider 400 may be a thrust force. Similarly, both the first limiting section 411 and the second limiting section 413 may be concave, to be conveniently abutted against by the abutting part in a limiting manner. The first limiting section 411 and the second limiting section 413 may also be of other structures provided that the abutting part can be matched with the first limiting section 411 and the second limiting section 413 in a limiting manner, so that the slider 400 can be maintained at the first position or the second position under the limitation of the abutting part.

As can be learned from the above, in this manner, the first end of the connecting rod 300 is located on one side of the slider 400 facing the first opening 130, so that the connecting rod 300 is closer to an edge of the device body 100. Since there are fewer electronic components distributed on the edge of the device body 100, the connecting rod 300 can be prevented from interfering with the electronic components in the device body 100.

In the embodiments of the present application, the first limiting section 411, the extending section 412, the second limiting section 413, and the retracting section 414 may be a groove section with various structures. Referring to FIG. 4, the extending section 412 may be a straight groove section, so that the functional module 200 can extend more quickly. Optionally, the retracting section 414 may include an arc-shaped groove section. Since the functional module 200 needs to be pressed by the user for a longer time during retraction, an arc-shaped groove section has a certain curvature to better guide the second end of the connecting rod 300 to a position at which the second end of the connecting rod 300 is matched with the first limiting section 411.

Figure 10:
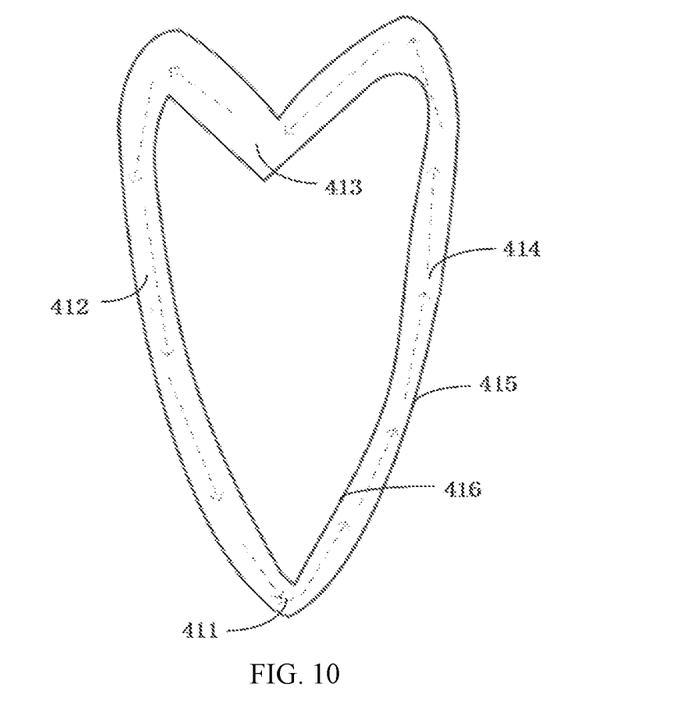
FIG. 10 is a schematic structural diagram of another guide rail disclosed in an embodiment of the present application.

The guide rail 410 may also be another structure and not limited to a groove-shaped structure. In one embodiment, the guide rail 410 may be a convex guide part. For example, referring to FIG. 10, the convex guide part may include a first annular protrusion 415 and a second annular protrusion 416, and a region between the first annular protrusion 415 and the second annular protrusion 416 is the guide rail 410. In this case, the first limiting section 411, the extending section 412, the second limiting section 413, and the retracting section 414 all may be at least a portion of the region between the first annular protrusion 415 and the second annular protrusion 416. During working, a sliding stroke of the second end of the connecting rod 300 may be as shown in FIG. 10, and a direction in which the second end of the connecting rod 300 slides relative to the guide rail 410 is schematically shown by a dashed arrow in FIG. 10. In this way, the sliding of the second end of the connecting rod 300 is smoother, thereby preventing the second end of the connecting rod 300 from being stuck during movement. Certainly, the first annular protrusion 415 and the second annular protrusion 416 may be formed by injection molding or in another manner. A forming manner of the first annular protrusion 415 and the second annular protrusion 416 is not limited in the present application.

In the embodiments of the present application, during the movement of the slider 400, the second end of the connecting rod 300 may be disengaged from the guide rail 410. Therefore, to achieve more steady sliding and matching, the device body 100 may further include a first housing 140. The first housing 140 may be provided with a sliding cavity. At least a portion of the slider 400 may be located in the sliding cavity and at least a portion of the connecting rod 300 may be located in the sliding cavity. In this case, the second end of the connecting rod 300 may slide inside the sliding cavity, so that the second end of the connecting rod 300 is prevented from being disengaged from the guide rail 410, thereby improving the sliding stability of the second end of the connecting rod 300.

Optionally, to enable the second end of the connecting rod 300 to better slide in the guide rail 410, the first housing 140 may include an elastic arm 141. At least a portion of the connecting rod 300 may be located between the elastic arm 141 and the guide rail 410. In this case, due to the elastic effect of the elastic arm 141, the second end of the connecting rod 300 can better slide in the guide rail 410, thereby preventing the second end of the connecting rod 300 from being disengaged from the guide rail 410.

After the above structure is adopted, at least a portion of the connecting rod 300 may slide between the elastic arm 141 and the guide rail 410. Based on this, optionally, the elasticity of the elastic arm 141 enables the second end of the connecting rod 300 to snugly fit the guide rail 410, so that the second end of the connecting rod 300 can be prevented from swinging between the elastic arm 141 and the guide rail 410, thereby better preventing the second end of the connecting rod 300 from being disengaged from the sliding of the guide rail 410.

In the electronic device disclosed in the embodiments of the present application, the functional module 200 can be separated from the device body 100, and the device body 100 can remotely control the functional module 200 to work.

In a case that the functional module 200 is separated from the device body 100, the first accommodating space 110 and the second accommodating space 120 may come into contact with an external environment, which is not conducive to the water-proof and dust-proof performance of the electronic device. Therefore, in one optional solution, the device body 100 may include a second housing 150. The second housing 150 has an inner cavity. The second housing 150 may include a separator 151. The separator 151 may be disposed inside the inner cavity. The separator 151 separates the inner cavity into a first sub-cavity, a second sub-cavity, and a third sub-cavity. The first sub-cavity and the second sub-cavity is hermetically separated from the third sub-cavity. The first sub-cavity is in communication with the second sub-cavity. The first sub-cavity is the first accommodating space 110, and the second sub-cavity is the second accommodating space 120. In this way, impurities can be prevented from entering into the inner space of the device body 100 through the first accommodating space 110 or the second accommodating space 120, thereby producing better water-proof and dust-proof effects.

The volume of the functional module 200 is generally small. When the functional module 200 is separated from the device body 100, the functional module 200 is easily lost. Therefore, the functional module 200 may include a functional module body and a sling, and the functional module body may be provided with a sling hole 230. The sling may be detachably connected to the functional module body by the sling hole 230. In this case, when the functional module body is separated from the device body 100, the user can carry the functional module body through the sling, thereby preventing the functional module body from being lost.

The electronic device disclosed in the embodiments of the present application may be a device such as a smartphone, a tablet computer, an e-book reader, a wearable device, or an electronic game console. A type of the electronic device is not limited in the embodiments of the present application.

In the foregoing embodiments of the present application, the differences between various embodiments are mainly described. The embodiments may all be combined to form better embodiments provided that the different optimization features of the various embodiments are not contradictory. In consideration of the brevity of the text, details are not described herein again.

The above descriptions are merely embodiments of the present application, and are not intended to limit the present application. A person skilled in the art may make various alterations and variations to the present application. Any modification, equivalent replacement, or improvement made within the spirit and principle of the present application shall fall within the protection scope of the present application.

What is claimed is:

1. An electronic device, comprising:
    a device body, wherein the device body is provided with a first accommodating space, a second accommodating space and a first opening in communication with the first accommodating space, and the second accommodating space is in communication with the first accommodating space;
    a functional module, wherein the functional module has a first state and a second state; and
    an ejection mechanism, wherein the ejection mechanism comprises a connecting rod, a slider, and a driving part, the functional module is detachably connected to the slider, a guide rail is disposed on the slider, and the guide rail comprises a first limiting section, an extending section, a second limiting section and a retracting section connected in sequence;
    at least a portion of the driving part is disposed inside the second accommodating space, the driving part drives the slider to move along a direction perpendicular to the first opening, a first end of the connecting rod is hinged to an inner wall of the second accommodating space, and a second end of the connecting rod is slidably matched with the guide rail;
    in a case that the functional module is in the first state, the functional module is separated from the slider;
    in a case that the functional module is in the second state, the functional module is connected to the slider, and the slider is movable between a first position and a second position, in a case that the slider is located at the first position, the slider is located inside the second accommodating space, and in a case that the slider is located at the second position, at least a portion of the slider is located outside the second accommodating space;
    in the case that the slider is located at the second position, at least a portion of the functional module is located outside the first accommodating space, and the second end of the connecting rod is matched with the first limiting section; and
    in the case that the slider is located at the first position, the functional module is located inside the first accommodating space, and the second end of the connecting rod is matched with the second limiting section.

2. The electronic device according to claim 1, wherein the ejection mechanism further comprises a connecting base, the connecting base is connected to the slider, the slider is detachably connected to the functional module by the connecting base, and in a telescopic direction of the function module, a projection area of the connecting base is larger than a projection area of the slider.

3. The electronic device according to claim 2, wherein in the case that the functional module is in the first state, the connecting base is hermetically connected to the first opening.

4. The electronic device according to claim 3, wherein in the case that the functional module is in the first state, an outer surface of the connecting base is flush with an outer surface on which the first opening is located.

5. The electronic device according to claim 2, wherein a first electrical interface is disposed on the functional module, a second electrical interface is disposed on one side of the connecting base away from the slider, a third electrical interface is disposed on one side of the connecting base facing the slider, the second electrical interface is electrically connected to the third electrical interface, a fourth electrical interface is disposed inside the first accommodating space, in a case that the functional module is located inside the first accommodating space, the first electrical interface is electrically connected to the second electrical interface, and the third electrical interface is electrically connected to the fourth electrical interface.

6. The electronic device according to claim 2, wherein a first magnetic attraction part is disposed on one of the functional module or one side of the connecting base away from the slider, a second magnetic attraction part is disposed on another of the functional module or one side of the connecting base away from the slider, and in a case that the functional module is in the second state, the first magnetic attraction part is magnetically connected to the second magnetic attraction part.

7. The electronic device according to claim 1, wherein the driving part is an elastic member, one end of the elastic member is connected to the inner wall of the second accommodating space, and an other end of the elastic member is connected to the slider.

8. The electronic device according to claim 7, wherein a first guide post is disposed on the inner wall of the second accommodating space, a second guide post is disposed on the slider, one end of the elastic member is sleeved on the first guide post, and the other end of the elastic member is sleeved on the second guide post.

9. The electronic device according to claim 1, wherein the driving part comprises a third magnetic attraction part and a fourth magnetic attraction part, wherein the third magnetic attraction part is disposed inside the second accommodating space, the fourth magnetic attraction part is connected to the slider, the third magnetic attraction part and the fourth magnetic attraction part are disposed opposite to each other, and the third magnetic attraction part has a same magnetic property as the fourth magnetic attraction part.

10. The electronic device according to claim 1, wherein the second end of the connecting rod is a pull hook, and the pull hook is hung on the guide rail, or the second end of the connecting rod is an abutting part, and the abutting part abuts against the guide rail.

11. The electronic device according to claim 1, wherein the device body further comprises a first housing, the first housing is provided with a sliding cavity, at least a portion of the slider is located in the sliding cavity, and at least a portion of the connecting rod is located in the sliding cavity.

12. The electronic device according to claim 11, wherein the first housing comprises an elastic arm, and at least a portion of the connecting rod is located between the elastic arm and the guide rail.

13. The electronic device according to claim 1, wherein the device body comprises a second housing, the second housing has an inner cavity, the second housing comprises a separator, the separator is disposed inside the inner cavity, the separator separates the inner cavity into a first sub-cavity, a second sub-cavity, and a third sub-cavity, the first sub-cavity and the second sub-cavity are hermetically separated from the third sub-cavity, the first sub-cavity is in communication with the second sub-cavity, the first sub-cavity is the first accommodating space, and the second sub-cavity is the second accommodating space.

14. The electronic device according to claim 1, wherein the guide rail is an annular rail, a first end of the first limiting section is connected to the extending section, a second end of the first limiting section is connected to the retracting section, a first end of the second limiting section is connected to the extending section, and a second end of the second limiting section is connected to the retracting section.

\* \* \* \* \*